United States Patent
Xu et al.

(10) Patent No.: US 6,168,898 B1
(45) Date of Patent: Jan. 2, 2001

(54) POSITIVE ACTING PHOTODIELECTRIC COMPOSITION

(75) Inventors: Chengzeng Xu, Succasunna, NJ (US); Ming Mei Huang, Los Angeles, CA (US); Laura M. Leyrer, Morris Plains, NJ (US)

(73) Assignee: Isola Laminate Systems Corp., LaCrosse, WI (US)

( * ) Notice: Under 35 U.S.C. 154(b), the term of this patent shall be extended for 0 days.

(21) Appl. No.: 09/024,997

(22) Filed: Feb. 17, 1998

(51) Int. Cl.[7] ............................. G03F 7/021; G03F 7/029; G03F 7/09
(52) U.S. Cl. .................. 430/176; 430/280.1; 430/278.1; 430/272.1; 430/275.1; 430/277.1; 430/271.1; 430/162; 522/31; 522/32; 522/129
(58) Field of Search .............................. 430/280.1, 278.1, 430/272.1, 275.1, 277.1, 271.1, 162, 176; 522/31, 32, 129

(56) References Cited

U.S. PATENT DOCUMENTS

| | | | |
|---|---|---|---|
| 3,752,669 | * 8/1973 | Abolafia | 96/36.2 |
| 4,398,013 | * 8/1983 | Johnson | 528/89 |
| 4,968,581 | 11/1990 | Wu et al. | 430/192 |
| 5,081,001 | 1/1992 | Osuch et al. | 430/296 |
| 5,124,233 | * 6/1992 | Meier et al. | 430/280.1 |
| 5,334,487 | 8/1994 | Kindl et al. | 430/312 |
| 5,354,593 | 10/1994 | Grandmont et al. | 428/137 |
| 5,432,039 | * 7/1995 | Shimokawa et al. | 430/191 |
| 5,451,487 | 9/1995 | Tsukada et al. | 174/261 |
| 5,879,859 | * 3/1999 | Buchwalter et al. | 430/280.1 |

* cited by examiner

*Primary Examiner*—Cynthia Hamilton
(74) *Attorney, Agent, or Firm*—McDonnell Boehnen Hulbert & Berghoff

(57) ABSTRACT

A positive acting, photoimageable composition having, a photoacid generator capable of generating an acid upon exposure to actinic radiation, an organic acid anhydride polymer, an epoxy, a nitrogen-containing curing catalyst, and an optional phenol-containing monomer or polymer. A photographic element has this composition coated and dried on a substrate.

A positive acting image is produced by imagewise exposing the element to actinic radiation, optionally postbaking and development with a liquid developer.

17 Claims, No Drawings

POSITIVE ACTING PHOTODIELECTRIC COMPOSITION

BACKGROUND OF THE INVENTION

1. Field of the Invention

The present invention pertains to microdevice manufacture by photolithography. More particularly, the invention relates to a photosensitive composition that can be used as a permanent dielectric in electronic circuits.

2. Description of the Prior Art

It is known to the skilled artisan to produce positive photoresist compositions such as those described in U.S. Pat. Nos. 3,666,473; 4,115,128 and 4,173,470. These include water insoluble, aqueous alkali-soluble resins together with light-sensitive materials. Upon imagewise exposure of portions of the coated substrate to actinic radiation, the sensitizer is rendered alkali soluble and the exposed areas of the coating therefore become more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate. The exposed and developed substrate is usually thereafter subjected to an etching process. The photoresist coating protects the coated areas of the substrate from the etchant and thus the etchant is only able to etch the uncoated areas of the substrate, which correspond to the areas that were exposed to actinic radiation. Thus, an etched pattern can be created on the substrate which corresponds to the pattern of the mask that was used to create selective exposure patterns on the coated substrate prior to development. The relief pattern of photoresist on a substrate produced by this method is useful for various applications including the manufacture of miniaturized integrated circuits.

As the ability to wire-bond integrated circuits reaches the limits of technology, the density of a chip places increasing demands on utilization of the board area. This drives the need for a high density package with a significant amount of interconnections on the outer surface of a multilayer board as well as for increasing use of blind microvias. Resin coated copper has been used to fabricate high density buildup multilayer printed circuit boards. Currently microvias in such circuit boards are produced by two methods including plasma etching and laser drilling. As such, only fabricators with access to plasma or laser via hole fabrication can provide these advanced, blind-via boards. The high cost of the plasma and laser equipment hinders wide adoption of resin coated copper technology. Furthermore, the technical disadvantages associated with the plasma etching and laser drilling techniques such as undercutting due to isotropic etching of plasma and low throughput due to sequential drilling by laser also limit large scale commercialization of resin coated copper based high density multilayer circuit boards. Photodefinable resin coated copper, which allows for mass production of microvias by photolithography, has been developed to address the issues related to the plasma and laser microvia technologies. This invention provides for an aqueous developable, positive acting photodielectric composition, which can be used to mass produce microvias via photo resin coated copper technology. The composition is also useful for producing solder masks.

Photo resin coated copper allows for mass production of microvias by photolithography. Circuit board fabricators have photolithography capability and can thus easily adopt the new technology. Moreover, photodefinition of microvias avoids the undercut and low throughput problems associated with plasma and laser methods, respectively. This invention provides an aqueous developable, positive acting photodefinable resin, which enables photo resin coated copper technology.

Image forming photoresists useful for photolithography are well known in the art as exemplified by U.S. Pat. No. 4,968,581 and U.S. Pat. No. 5,081,001. However, most commercial positive photoresists are not designed as permanent dielectrics, but are removed during microdevice manufacture. Commercial photoresist compositions suffer from poor thermal and photo stability, high moisture uptake and inadequate dielectric properties and hence are not suitable for permanent applications. This invention provides a photodielectric composition for a permanent photoresist that can be used as a permanent dielectric in electronic circuits. This photodielectric is epoxy based and is similar to the common epoxy dielectrics that are currently used in the electronics industry. After final cure, this photodielectric provides for excellent thermal and photo stability and good dielectric performance.

The composition includes a mixture of epoxy resins, anhydride polymers such as styrene maleic anhydride (SMA) copolymers, an amine catalyst, a photo acid, and optionally phenol containing polymers such as phenolic resins. The amine catalyst catalyzes the curing reaction between SMA and epoxy and/or between phenol and epoxy. Upon photo exposure, an acid is generated from the photo acid. The acid neutralizes the amine catalyst and decreases its catalytic activity. Therefore, the exposed resin cures much slower than the non-exposed resin during thermal baking. The differentiation in curing speed leads to differentiation of solubility in a developer solution between the exposed and non-exposed resins. When a film of the resin is exposed to light through a photomask, the mask features can be reproduced in the film after developing. Since the photoexposure inhibits thermal curing and makes the exposed part more soluble than the non-exposed part a positive image is obtained.

The photodielectric composition can be coated on a variety of substrates. Desired structures can be obtained by photolithographic techniques. Because of its thermal and photostability and good dielectric properties as well as its excellent photo resolution, this photodielectric can be used as a permanent dielectric in printed wiring boards and high density packaging interconnection substrates where fine features such as nicrovias are required.

SUMMARY OF THE INVENTION

The invention provides a positive acting, photoimageable composition which comprises at least one a photoacid generator capable of generating an acid upon exposure to actinic radiation, at least one organic acid anhydride monomer or polymer, at least one epoxy, at least one nitrogen-containing curing catalyst, and an optional aromatic hydroxyl containing monomer, polymer or mixture thereof.

The invention also provides a photographic element which comprises a substrate and a dried positive acting, photoimageable composition on the substrate, which composition comprises at least one a photoacid generator capable of generating an acid upon exposure to actinic radiation, at least one organic acid anhydride monomer or polymer, at least one epoxy, at least one nitrogen-containing curing catalyst, and an optional aromatic hydroxyl containing monomer, polymer or mixture thereof.

The invention further provides a process for producing a positive image which comprises a) providing a photographic element which comprises a substrate and a dried positive acting, photoimageable composition on the substrate, which composition comprises at least one a photoacid generator capable of generating an acid upon exposure to actinic radiation, at least one organic acid anhydride monomer or polymer, at least one epoxy, at least one nitrogen-containing curing catalyst, and an optional aromatic hydroxyl containing monomer, polymer or mixture thereof, b) imagewise exposing the composition to sufficient actinic radiation to thereby provide imagewise exposed and imagewise nonexposed portions of the composition; and c) removing the imagewise exposed portions of the composition with a liquid developer.

DETAILED DESCRIPTION OF THE PREFERRED EMBODIMENT

In the practice of the present invention, a positive acting, photoimageable composition is produced by admixing a photoacid generator capable of generating an acid upon exposure to actinic radiation, an organic acid anhydride monomer or polymer, an epoxy, a nitrogen-containing curing catalyst, and an optional phenol-containing monomer or polymer.

The photoacid generator used herein is one which generates an acid upon exposure to actinic radiation such as ultraviolet radiation. Photoacid generators are known in the photoimaging art and include, but are not limited to, onium compounds such as aryl derivatives of sulfonium, iodonium and diazonium salts, and organic compounds with photo-labile halogen atoms.

Preferred photoacid generators include tryarylsulfonium and diaryliodonium salts with hexafluorophosphate, hexafluoroantimonate, hexafluoroarsenate, and tetrafluoroborate anions. Non-limiting examples of suitable iodonium salts are salts of diphenyliodonium, dinaphthyliodonium, di(4-chlorophenyl)iodonium, tolyl(dodecylphenyl)iodonium, naphthylphenyliodonium, 4-(trifluoromethylphenyl)phenyliodonium, 4-ethylphenylphenyliodonium, di(4-acetylphenyl)iodonium, tolylphenyliodonium, 4-butoxyphenylphenyliodonium, di(4-phenylphenyl)iodonium, and the like. Di-phenyliodonium salts are preferred. Non-limiting examples of suitable sulfonium salts are salts of triphenylsulfonium, dimethylphenylsulfonium, tritolylsulfonium, di(methoxynaphthyl)methylsulfonium, dimethylnaphthylsulfonium, 4-butoxyphenyldiphenylsulfonium, and 4-acetoxyphenyldiphenylsulfonium. Tri-phenylsulfonium salts are preferred. Organic compounds with photolabile halogen atoms include alpha-halo-p-nitrotoluenes, alpha-halomethyl-s-triazines, carbon tetrabromide, and the like. These acid generators may be used singly or in combination of two or more thereof.

The photoacid generator component is preferably present in an amount of from about 0.05% to about 20% of the total weight of the nonsolvent parts of the composition, more preferably from about 0.2% to about 10%, and most preferably from about 0.5% to about 5% by weight of the nonsolvent parts of the composition.

The composition then contains an organic acid anhydride monomer or polymer component. Suitable acid anhydrides are anhydride functional polymers, having a number average molecular weight of from about 500 to about 50,000, preferably from about 1,000 to about 10,000. Nonlimiting examples of suitable anhydrides include styrene-maleic anhydride, styrene-alkyl methacrylate-itaconic anhydride, methyl methacrylate-butyl acrylate-itaconic anhydride, butyl acrylate-styrene-maleic anhydride, and the like. Preferred are styrene-maleic anhydride polymers with styrene to maleic anhydride molar ratio of from about 1:1 to about 3:1. Also suitable are dodecenyl succinic anhydride, trimellitic anhydride, chloroendic anhydride, phthalic anhydride, methylhexahydrophthalic anhydride, 1-methyl tetrahydrophthalic anhydride, hexahydrophthalic anhydride, methylnadic anhydride, methylbutenyltetrahydrophthalic anhydride, benzophenone tetracarboxylic dianhydride, methylcyclohexenedicarboxylic anhydride. These acid anhydrides may be used singly or in combination of two or more thereof.

This anhydride component is preferably present in the composition in an amount of from about 10% to about 90%, more preferably from about 20% to about 80% and most preferably from about 35% to about 65% by weight of the nonsolvent parts of the composition.

The composition then contains an epoxy component. The epoxy may vary in the structure of their backbones and substituent groups as well as in molecular weights, equivalent epoxy weights (EEW) and in the number of epoxy groups per molecule. Suitable epoxies have number average molecular weights ranging from about 100 to about 20,000, preferably from about 200 to about 5,000 and have an EEW of from about 50 to about 10,000, preferably from about 100 to about 2,500, and have an average number of epoxy groups per molecule of from about 1 to about 40, preferably from about 2 to about 10.

Particularly suitable epoxy resins include, for example, the diglycidyl ethers of resorcinol, catechol, hydroquinone, biphenol, bisphenol A, bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins tetramethylbiphenol, tetramethyltetrabromobiphenol, any combination thereof and the like. Also suitable are the alkylene oxide adducts of compounds of more than one aromatic hydroxyl group per molecule such as the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenolaldehyde novolac resins, phenol-hydroxybenzaldehyde resins, cresol-hydroxybenzaldehyde resins, any combination thereof and the like. Also suitable are the glycidyl ethers of compounds having an average of more than one aliphatic hydroxyl group per molecule such as aliphatic polyols and polyether polyols. Non-limiting examples include polyglycidyl ethers of polyethylene glycols, polypropylene glycols, glycerol, polyglycerols, trimethylolpropane, butanediol, sorbitol, pentaerythritol, and combinations thereof.

The epoxy component is preferably present in an amount of from about 10% to about 90%, more preferably from about 20% to about 80% and most preferably from about 35% to about 65% by weight of the nonsolvent parts of the composition.

The molar ratio of epoxy to anhydride is preferably from 0.1 to 10, more preferably 0.2 to 5, most preferably 0.5 to 2.0.

The composition then contains a nitrogen containing catalyst which catalyzes the curing between the epoxy and anhydride and optional phenolic. Preferred catalysts are secondary and tertiary amines as well as phosphines and arsines and blends thereof. Preferred amine catalysts are imidazoles, for example, imidazole, benzimidazole, 2-methyl imidazole, 2-ethyl-4-methylimidazole; 1 2-dimethylimidazole; 2-hexylimidazole, 2-cyclohexylimidazole, 2-phenylimidazole, 2-phenyl-4-methylimidazole, 1-benzylimidazole, 1-ethyl-2-methylbenzimidazole, 2-methyl-5,6-benzimidazole, 1-vinylimidazole, 1-allyl-2-methylimidazole, 2-cyanoimidazole, 2-chloroimidazole, 2-bromoimidazole, 1-(2-hydroxypropyl)-2-methylimidazole, 2-phenyl-4,5-dimethylolimidazole, 2-phenyl-4-methyl-5-hydroxymethylimidazole. 2-chloromethylbenzimidazole, 2-hydroxybenzimidazole. 2-ethyl-4-methyl imidazole; 2-cyclohexyl-4-methyl imidazoles; 2-butoxy-4-allyl imidazole; 2-carboethyoxybutyl, 4-methyl-imidazole, 2-methyl-4-mercaptoethyl imidazole, and 2-phenyl imidazole. More preferred are 1-methyl imidazole, 2-ethyl imidazole, 2-ethyl-4-methylimidazole, 2-phenylimidazole, 2-methyl-4-nitroimidazole, 4-methylimidazole. A more detailed description of the chemistry of the imidazoles and benzimidazole including their properties and structural formulas is found in the book by Klaus Hofmann entitled "Imidazole and Its Derivates" published by Interscience Publishers, Inc., New York (1953).

Other preferred heterocyclic secondary and tertiary amines or nitrogen-containing compounds which can be employed herein include, for example, imidazolidines, imidazolines, oxazoles, pyrroles, thiazoles, pyridines, pyrazines, morpholines, pyridazines, pyrimidines, pyrrolidines, pyrazoles, quinoxalines, quinazolines, phihalozines quinolines, purines, indazoles, indoles, indolazines, phenazines, phenarsazines, phenothiazines, pyrrolines, indolines, piperidines, piperazines and combinations thereof.

Also suitable are other aliphatic cyclic amines such as 1,5-diazabicyclo[4.3.0]non-5-ene, 1,4-diazabicyclo[2.2.2]octane, 1,8-diazabicyclo[5.4.0]undec-7-ene.

Also preferred are secondary and tertiary non-cyclic amines such as, for example, octyldimethylamine, tris-dimethylaminomethyl phenol, benzyldimethylamine, N,N-dimethylamine, triethylamine, trimethylamine, N,N,N',N'-tetramethylbutane-diamine, N,N,N',N'-tetramethylhexanediamine, triisooctylamine, N,N-dimethyl aniline, triphenyl amine, and the like.

Suitable phosphines include, for example, triphenyl phosphine, trimethyl phosphine, tripropyl phosphine, tributyl phosphine, tripentyl phosphine, triheptyl phosphine, trioctyl phosphine, trinonyl phosphine, tridecyl phosphine, tridodecyl phosphine, bis(diphenylphosphino)-methane, 1,2-bis(diphenylphosphino)-ethane, 1,3-bis(diphenylphosphino)-propane, 1,2-bis(dimethylphosphino)-ethane, 1,3-bis(dimethylphosphino)propane, and combinations thereof. Suitable arsines include, for example, triphenyl arsine, tributyl arsine, and combinations thereof.

The catalyst amount is preferably present in an amount of from about 0.01 to about 10%, more preferably from about 0.02 to about 5%, and most preferably from about 0.05 to about 2% by weight of the nonsolvent parts of the composition.

The composition then contains an optional aromatic hydroxyl containing compounds such as a phenolic monomer or polymer or mixture thereof. Suitable aromatic hydroxyl containing compounds which can be employed herein include, for example, compounds having an average of more than one phenolic hydroxyl group per molecule. Suitable such compounds include, for example, dihydroxy phenols, bi-phenols, bisphenols, halogenated bisphenols, alkylated bisphenols, trisphenols, phenol-aldehyde resins, halogenated phenol-aldehyde novolac resins, alkylated phenol-aldehyde novolac resins, phenol-hydroxybenzaldehyde resins, alkylated phenol-hydroxybenzaldehyde resins, the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenolaldehyde novolac resins, alkylated phenol-aldehyde novolac resins, cresol-aldehyde novolac resins, phenol-hydroxybenzaldehyde resins, cresol-hydroxybenzaldehyde resins, vinyl phenol polymers, any combination thereof and the like.

When phenol containing compounds or polymers are used, it is preferably present in an amount of from about 1% to about 50%, more preferably from about 5% to about 40%, and most preferably from about 10% to about 30% based on the weight of the nonsolvent parts of the composition.

When phenol containing compounds or polymers are used, the catalyst amount is preferably from about 0.01 to about 10%, more preferably from about 0.02 to about 5%, and most preferably from about 0.05 to about 2% based on the weight of the nonsolvent parts of the composition.

When phenol containing compounds or polymers are used the photoacid amount is preferably from about 0.05 to about 20%, more preferably from about 0.2 to about 10%, and most preferably from about 0.5 to about 5% based on the weight of the nonsolvent parts of the overall composition.

When phenol containing compounds or polymers are used the epoxy is preferably from about 10% to about 90%, more preferably from about 20% to about 70%, and most preferably from about 30% to about 60% based on the weight of the nonsolvent parts of the overall composition.

When phenol containing compounds or polymers are used the anhydride is preferably from about 10% to about 90%, more preferably from about 20% to about 70%, and most preferably from about 30% to about 60% based on the weight of the nonsolvent parts of the overall composition.

When phenol containing compounds or polymers are used, the molar ratio of epoxy to combined anhydride and phenolic is from about 0.1 to about 10, more preferably from about 0.2 to about 5, and most preferably from about 0.5 to about 2.0. The molar ratio of anhydride to phenolic is from about 20 to about 0.5, preferably from about 10 to about 1.0.

Other additives that may be optionally included in the compositions of the invention are fillers, colorants such as dyes and pigments, surfactants, fire retardants, plasticizers, antioxidants and the like. Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Surfactants that may be used include, for example, nonylphenoxy poly(ethyleneoxy) ethanol; octylphenoxy ethanol at up to 10% by weight of the composition. Plasticizers which may be used include, for example, phosphoric acid tri-(beta-chloroethyl)-ester; stearic acid; dicamphor; polypropylene; acetal resins; phenoxy resins; and alkyl resins at up to 10% by weight of the composition. The plasticizer additives improve the coating properties of the material and enable the application of a film that is smooth and of uniform thickness to the substrate.

The composition may be prepared by blending the component parts together with a suitable solvent which is compatible with the components. Useful solvents include alcohols, ethers, esters, ketones, and acetates among others. Preferred solvents include tetrahydrofuran, isobutyl isobutyrate, glycol ethers such as propylene glycol monomethyl ether and methyl cellosolve, alcohols such as ethanol and n-propanol and ketones such as methyl ethyl ketone, ketones such as acetone, methyl ethyl ketone (MEK), butyl acetate, xylene, ethylene glycol monoethyl ether acetate, and propylene glycol mono-methyl ether acetate, among others. The coating solvents may be present in the overall composition in an amount of up to 95% by weight of the total composition. Solvents, of course are substantially removed after coating of the solution on a substrate and drying. In general, the solvent composition is evaporated from the coating composition once it is applied to an appropriate substrate. However, some insignificant amount of solvent may remain as residue.

The prepared solvent solution composition is then coated on a substrate by well known techniques such as but not limited to spin coating, slot die coating, extruding, Meyer rod drawing, blade drawing, screen coating, curtain coating, dip coating, or spray coating. Examples of useful substrates include metals such as aluminum, aluminum alloys, and other metals and metal alloys such as steel, stainless steel, zinc, copper and chromium, polymers such as polyester film, polyimide film and epoxy, silicon wafer, gallium arsenide, glass, etc. The coating is dried or solidified by baking at elevated temperatures. The baking condition is selected such that a tack-free dry film is formed without fully curing the resin. The baking conditions vary significantly with the formulation. Typically baking may be done at temperatures of from about 50° C. to about 150° C., preferably from about 80° C. to about 120° C. for from about 0.5 to about 60 minutes, preferably from about 1 to about 20 minutes. Once the coating is applied to the substrate, the solvents are evaporated to yield a dry coating weight of from about 0.7 to about 2 g/m$^2$, more preferably from about 1.0 to about 1.8 g/m$^2$, and most preferably from about 1.2 to about 1.5 g/m$^2$.

Once the photosensitive composition is formed onto the substrate in a thin or thick film, actinic radiation is directed onto the film in order to delineate the light transmissive region. The radiation pattern must be chosen so that the photosensitive composition is imaged in the desired pattern and so that other regions of the film remain unreacted. The photosensitive resin of the invention is conventionally imaged by exposing the composition to actinic radiation of the required wavelength and intensity for the required duration. As used herein "actinic radiation" is defined as light in the visible, ultraviolet or infrared regions of the spectrum, as well as electron beam, ion or neutron beam or X-ray radiation. Actinic radiation may be in the form of incoherent light or coherent light, for example, light from a laser. Sources of actinic light, and exposure procedures, times, wavelengths and intensities may vary widely depending on the desired degree of photo-reaction and other factors known to those of ordinary skill in the art. Such conventional photo-reaction processes and their operational parameters are well known in the art. Sources of actinic radiation and the wavelength of the radiation may vary widely, and any conventional wavelengths and sources can be used. Mercury vapor discharge lamps are preferred over metal halide lamps. Other radiation sources, such as carbon arc, pulsed xenon, and lasers, may also be used. Light absorbing filters may be used to reduce light scattering in the materials. It is preferable that the photochemical excitation be carried out with relatively short wavelength (or high energy) radiation so that exposure to radiation normally encountered before processing (e.g., room lights) will not prematurely react. Alternatively, the processing can utilize a multi-photon process initiated by a high intensity source of actinic radiation such as a laser. Thus, exposure to ultraviolet light at 300–400 nm wavelength is convenient. Also, exposure by deep ultraviolet light at 190–300 nm wavelength is useful. Convenient sources are high pressure xenon or mercury-xenon arc lamps fitted with appropriate optical filters to select the desired wavelengths for processing.

Control of the spatial profile of the actinic radiation, that is, where it falls on the layer of photosensitive material may be achieved by conventional methods. For example, in one conventional method, a mask bearing the desired light transmissive pattern is placed between the source of actinic radiation and the photosensitive composition film. The mask has transparent and opaque regions which allow the radiation to fall only on the desired regions of the film surface. Masked exposure of thin films is well known in the art and may include contact, proximity and projection techniques for printing the light transmissive pattern onto the film. After the photosensitive composition has been exposed to form the predetermined pattern of the photopolymer on the surface of the substrate, the pattern is then postbaked. The postbake condition is selected such that the non-exposed areas cure faster that the exposed areas, which is indicated by the lower solubility of the former than the latter in a developer solution. The appropriate postbake condition varies significantly with the formulation and photo exposure. Typical post baking is done at a temperature of from about 90° C. to about 200° C., preferably from about 110° C. to about 170° C. for from about 0.5 to about 60 minutes, preferably from about 1 to about 20 minutes.

The postbaked film on a substrate is developed to remove the exposed areas and leave behind the predetermined pattern. Any conventional development method can be used, for example, spray developing and immersion developing. Spray developing is preferred. The composition of this invention can be developed using a variety of developers including common organic solvents such as, for example, methylene chloride, methyl ethyl ketone, g-butyrolactone, acetone and the like, and aqueous solutions of, for example, carbonates, hydroxides, amines, and the like. Aqueous developers are preferred. Examples of suitable aqueous developers include but not limited to aqueous solutions of phosphates, silicates, metasilicates, hydroxides or metabisulfites. Such non-exclusively include mono-, di- and tri-alkali metal phosphate, alkali metal silicates such as sodium silicate, alkali metal metasilicate and alkali metabisulfite; and alkali metal hydroxides such as sodium hydroxide, potassium hydroxide and ammonium hydroxide solutions, monoethanol amine, tetra methyl ammonium hydroxide, in water, and the like. Typical developer compositions are alkaline in nature and have a pH range of from about 8 to about 14, preferably from about 10 to about 14. The developers may also contain art recognized surfactants, buffers, modifiers and other ingredients. Surfactants or other organic modifiers such as 2-butoxy ethanol can be optionally added to the developer solution. The concentration of the aqueous developer is preferably from about 0.5% to about 20%, more preferably from about 1% to about 10%. The developer temperatures range from about room temperature to about 65° C., preferably from about 35 to about 50° C. The developing time is preferably from about 10 seconds to about 20 minutes, more preferably from about 0.5 minutes to about 10 minutes. After developing the substrate is rinsed with deionized water, dried, and optionally further baked to effect further curing. The thusly produced layer finds use as a dielectric or solder mask in microelectronic devices.

The following non-limiting examples serve to illustrate the invention.

EXAMPLE 1

A photosensitive resin was prepared by mixing, at room temperature and under yellow lights, two epoxy monomers, EPON 1001F by Shell Chemical Company at 8% by weight and Denacol EX-512 by Nagase Chemical at 16%, a styrene maleic anhydride oligomer, SMA 1000 by Elf Autochem Inc. at 24%, a photoacid, CD 1011 from Sartomer Company at 2.5%, 2-ethyl-4-methylimidazole (EM) at 0.3%, and a solvent, methyl ethyl ketone (MEK) at 49.2%. This monomer mixture was coated on a glass substrate to a thickness of 50 to 100 $\mu$m. The coating was baked in a 90° C. oven for 5 minutes to form a tack-free dry film. It was found that an exposure of 60 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 $\mu$m diameter. Following the exposure the coating was baked in a 150° C. oven for 2 minutes and developed by immersion in 2% NaOH aqueous solution. Microvia holes of 50 to 200 $\mu$m diameter have been fabricated.

EXAMPLE 2

A photosensitive resin was prepared mixing, at room temperature and under yellow lights, two epoxy monomers, EPON 1001F by Shell Chemical Company at 8% by weight and Denacol EX-614B by Nagase Chemical at 16%, a styrene maleic anhydride oligomer, SMA 1000 by Elf Autochem Inc. at 24%, a photoacid, CD 1011 from Sartomer Company at 2%, 2-ethyl-4-methylimidazole (EMI) at 0.1%, and a solvent, methyl ethyl ketone (MEK) at 49.9%. This monomer mixture was coated on a glass substrate to a thickness of 50 to 100 $\mu$m. The coating was baked in a 90° C. oven for 5 minutes to form a tack-free dry film. It was found that an exposure of 60 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 $\mu$m diameter. Following the exposure the coating was baked in a 150° C. oven for 5 minutes and developed by immersion in 2% NaOH aqueous solution. Microvia holes of 50 to 200 $\mu$m diameter have been fabricated.

EXAMPLE 3

A photosensitive resin was prepared mixing, at room temperature and under yellow lights, one epoxy monomer, Denacol EX-512 by Nagase Chemical at 24%, a styrene maleic anhydride oligomer, SMA 1000 by Elf Autochem Inc. at 24%, a photoacid, CD 1011 from Sartomer Company at 2%, 2-ethyl-4-methylimidazole (EMI) at 0.2%, and a solvent, methyl ethyl ketone (MEK) at 49.8%. This monomer mixture was coated on a glass substrate to a thickness of 50 to 100 $\mu$m. The coating was baked in a 90° C. oven for 5 minutes to form a tack-free dry film. It was found that an exposure of 100 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 $\mu$m diameter. Following the exposure the coating was baked in a 140° C. oven for 5 minutes and developed by immersion in 2% NaOH aqueous solution. Microvia holes of 50 to 200 $\mu$m diameter have been fabricated.

EXAMPLE 4

A photosensitive resin was prepared mixing, at room temperature and under yellow lights, two epoxy monomers, EPON 1001F by Shell Chemical Company at 8% by weight and Denacol EX-512 by Nagase Chemical at 16%, a styrene maleic anhydride oligomer, SMA 2000 by Elf Autochem Inc. at 24%, a photoacid, CD 1011 from Sartomer Company at 2%, 2-ethyl-4-methylimidazole (EMI) at 0.2%, and a solvent, methyl ethyl ketone (MEK) at 49.8%. This monomer mixture was coated on a glass substrate to a thickness of 50 to 100 $\mu$m. The coating was baked in a 90° C. oven for 5 minutes to form a tack-free dry film. It was found that an exposure of 100 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 $\mu$m diameter. Following the exposure the coating was baked in a 140° C. oven for 5 minutes and developed by immersion in 2% NaOH aqueous solution. Microvia holes of 50 to 200 $\mu$m diameter have been fabricated.

EXAMPLE 5

A photosensitive resin was prepared mixing, at room temperature and under yellow lights, two epoxy monomers, EPON 828 by Shell Chemical Company at 12% by weight and Denacol EX-614B by Nagase Chemical at 12%, a styrene maleic anhydride oligomer, SMA 1000 by Elf Autochem Inc. at 24%, a photoacid, CD 1011 from Sartomer Company at 2%, 2-ethyl-4-methylimidazole (EMI) at 0.2%, and a solvent, methyl ethyl ketone (MEK) at 49.8%. This monomer mixture was coated on a glass substrate to a thickness of 50 to 100 $\mu$m. The coating was baked in a 90° C. oven for 5 minutes to form a tack-free dry film. It was found that an exposure of 80 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 $\mu$m diameter. Following the exposure the coating was baked in a 150° C. oven for 5 minutes and developed by immersion in 10% monoethanolamine aqueous solution. Microvia holes of 50 to 200 $\mu$m diameter have been fabricated.

EXAMPLE 6

A photosensitive resin was prepared by mixing at room temperature under yellow lights an epoxy monomer, EPON 1163 by Shell Chemical Company at 24% by, a styrene maleic anhydride oligomer, SMA 2000 by Elf Autochem Inc. at 24%, a photoacid, CD 1011 from Sartomer Company at 2.5%, 2-ethyl-4-methylimidazole (EMI) at 0.3%, and a solvent, methyl ethyl ketone (MEK) at 49.2%. This monomer mixture was coated on a glass substrate to a thickness of 50 to 100 $\mu$m. The coating was baked in a 90° C. oven for 5 minutes to form a tack-free dry film. It was found that an exposure of 80 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 μm diameter. Following the exposure the coating was baked in a 140° C. oven for 10 minutes and developed by immersion in 2% NaOH aqueous solution. Microvia holes of 50 to 200 μm diameter have been fabricated.

EXAMPLE 7

A photosensitive resin was prepared mixing, at room temperature and under yellow lights, two epoxy monomers, EPON 828 by Shell Chemical Company at 20% by weight and Denacol EX-614B by Nagase Chemical at 5%, a styrene maleic anhydride oligomer, SMA 2000 by Elf Autochem Inc. at 24%, a photoacid, CD 1011 from Sartomer Company at 2%, 2-ethyl-4-methylimidazole (EMI) at 0.2%, and a solvent, methyl ethyl ketone (MEK) at 48.8%. This monomer mixture was coated on a glass substrate to a thickness of 50 to 100 μm. The coating was baked in a 90° C. oven for 5 minutes to form a tack-free dry film. It was found that an exposure of 60 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 μm diameter. Following the exposure the coating was baked in a 140° C. oven for 6 minutes and developed by immersion in 10% monoethanolamine aqueous solution. Microvia holes of 50 to 200 μm diameter have been fabricated.

EXAMPLE 8

A photosensitive resin was prepared mixing, at room temperature and under yellow lights, two epoxy monomers, EPON 828 by Shell Chemical Company at 12% by weight and Denacol EX-512 by Nagase Chemical at 12%, a styrene maleic anhydride oligomer, SMA 1000 by Elf Autochem Inc. at 24%, a photoacid, CD 1011 from Sartomer Company at 2%, 2-ethyl-4-methylimidazole (EMI) at 0.2%, silica particles of 10–100 nm at 10%, and a solvent, methyl ethyl ketone (MEK) at 39.8%. This monomer mixture was coated on a glass substrate to form a clear film of 50 to 100 μm. The coating was baked in a 90° C. oven for 5 minutes to form a tack-free dry film. It was found that an exposure of 100 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 μm diameter. Following the exposure the coating was baked in a 150° C. oven for 2 minutes and developed by immersion in 2% NaOH aqueous solution. Microvia holes of 50 to 200 μm diameter have been fabricated.

EXAMPLE 9

A photosensitive resin was prepared mixing, at room temperature and under yellow lights, two epoxy monomers, EPON 1001F by Shell Chemical Company at 12% by weight and Denacol EX-512 by Nagase Chemical at 12%, a styrene maleic anhydride oligomer, SMA 1000 by Elf Autochem Inc. at 16%, a novolak resin HRJ1166 by Schenectady International Inc. at 8%, a photoacid, CD 1011 from Sartomer Company at 2.5%, 2-ethyl-4-methylimidazole (EMI) at 0.3%, and a solvent, methyl ethyl ketone (MEK) at 49.5%. This monomer mixture was coated on a glass substrate to a thickness of 50 to 100 μm. The coating was baked in a 90° C. oven for 5 minutes to form a tack-free dry film. It was found that an exposure of 100 sec through a quartz mask with light from a mercury-xenon arc lamp at 10 mW/cm$^2$ was sufficient to produce the desired degree of photolysis of the photoacid in the exposed regions. The mask was designed to produce microvia holes of from 25 to 200 μm diameter. Following the exposure the coating was baked in a 150° C. oven for 5 minutes and developed by immersion in 2% NaOH aqueous solution. Microvia holes of 50 to 200 μm diameter have been fabricated.

EXAMPLE 10

The photosensitive resin prepared in Example #2 is coated on a release treated polyester film using a slot die coater. The wet film is dried by prebaking at 90° C. for 5 minutes resulting in a 50 μm thick dry film. The photosensitive dry film backed by polyester is laminated to a circuitized inner layer board by a hot roll laminator with the roll temperature at about 120° C. The release film is peeled away leaving the photoresist laminated to the circuit board. The ensemble is allowed to cool and the dry film photoresist is exposed through an artwork with desired features for 100s using a 10 mW/cm$^2$ mercury/xenon arc lamp. The exposed panel is postbaked for 5 minutes at 150° C. After cooling down the panel is immersed in and sprayed with 2% tetramethylammonium hydroxide aqueous solution at 50° C. for 5 minutes to develop the image of the photosensitive layer. Microvia holes have been achieved with sizes in the range of 50–200 μm using this method.

EXAMPLE 11

The photosensitive resin prepared in Example #3 is screen coated directly onto the circuitized inner layer board. The wet film is dried by prebaking at 90° C. for 5 minutes resulting in a 25 μm thick dry film. The photosensitive dry film is exposed to UV light through an artwork with desired features. The exposed panel is postbaked for 5 minutes at 140° C. After cooling down the panel is then immersed in and sprayed with 2% NaOH aqueous solution at 40° C. for 5 minutes. Microvia holes have been achieved ranging in size from 50–200 μm using this method.

EXAMPLE 12

The photosensitive resin prepared in Example #7 is applied to a copper foil using a #80 Meyer rod. The wet film is dried by prebaking at 90° C. for 5 minutes resulting in a 50 μm thick dry film. The photosensitive dry film backed by copper foil is laminated to a circuitized inner layer board by a hot roll laminator with the roll temperature at about 120° C. In the same step an additional layer of dry film photoresist is laminated on top of the copper foil. The ensemble is allowed to cool and the dry film photoresist is exposed to UV light through an artwork with desired features. The dry film photoresist is developed, exposing the copper foil underneath. The copper foil is then etched away using a cupric chloride etchant at 50° C. resulting in a patterned foil. After rinsing and drying, the panel is flood exposed for 100s using a 10 mW/cm$^2$ mercury/xenon arc lamp. The exposed panel is postbaked for 6 minutes at 140° C. and after cooling down the panel is then immersed in and sprayed with 10% monoethanolamine aqueous solution at 50° C. for 5 minutes to strip the dry film photoresist and develop the image of the photosensitive layer. Microvia holes have been achieved with sizes in the range of 50–200 μm.

What is claimed is:

1. A positive acting, photoimageable composition which comprises at least one a photoacid generator capable of generating an acid upon exposure to actinic radiation, at least one styrene-maleic anhydride polymer, at least one epoxy, at least one curing catalyst selected from the group consisting of nitrogen containing curing catalysts, phosphine curing catalysts and arsine curing catalysts, and an optional aromatic hydroxyl containing monomer, polymer or mixture thereof.

2. The composition of claim 1 wherein the photoacid generator is an onium compound.

3. The composition of claim 1 wherein the photoacid generator is selected from the group consisting of sulfonium compounds, iodonium compounds, diazonium compounds, and organic compounds with photolabile halogen atoms, and mixtures thereof.

4. The composition of claim 1 wherein the photoacid generator component is present in an amount of from about 0.05% to about 20% by weight of the nonsolvent parts of the composition.

5. The composition of claim 1 wherein the styrene-maleic anhydride polymer has a number average molecular weight of from about 500 to about 50,000.

6. The composition of claim 1 wherein the acid anhydride polymer is present in an amount of from about 10% to about 90% by weight of the nonsolvent parts of the composition.

7. The composition of claim 1 wherein the epoxy has a number average molecular weight ranging from about 100 to about 20,000, an epoxy equivalent weight of from about 50 to about 10,000, and an average number of epoxy groups per molecule of from about 1 to about 40.

8. The composition of claim 1 wherein the epoxy is selected from the group consisting of diglycidyl ether of resorcinol, catechol, hydroquinone, biphenol, bisphenol A, bisphenol F, bisphenol K, tetrabromobisphenol A, phenol-formaldehyde novolac resins; alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins tetramethylbiphenol, tretramethyl-tetrabromobiphenol, and mixtures thereof.

9. The composition of claim 1 wherein the epoxy is present in an amount of from about 10% to about 90% by weight of the nonsolvent parts of the composition.

10. The composition of claim 1 wherein the curing catalyst is a nitrogen containing catalyst that is selected from the group consisting of secondary amines, and tertiary amines.

11. The composition of claim 10 wherein the nitrogen containing catalyst is selected from the group consisting of imidazoles, imidazolidines, imidazolines, oxazoles, pyrroles, thiazoles, pyridines, pyrazines, morpholines, pyridazines, pyrimidines, pyrrolidines, pyrazoles, quinoxalines, quinazolines, phihalozines quinolines, purines, indazoles, indoles, indolazines, phenazines, phenarsazines, phenothiazines, pyrrolines, indolines, piperidines, piperazines and mixtures thereof.

12. The composition of claim 10 wherein the nitrogen containing catalyst is present in an amount of from about 0.01 to about 10% by weight of the nonsolvent parts of the composition.

13. The composition of claim 1 wherein the aromatic hydroxyl containing compound is selected from the group consisting of dihydroxy phenols, biphenols, bisphenols, halogenated bisphenols, alkylated bisphenols, trisphenols, phenol-aldehyde resins, halogenated phenol-aldehyde novolac resins, alkylated phenol-aldehyde novolac resins, phenol-hydroxybenzaldehyde resins, alkylated phenol-hydroxybenzaldehyde resins, the ethylene oxide, propylene oxide, butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenol-aldehyde novolac resins, cresol-aldehyde novolac resins, phenol-hydroxybenzaldehyde resins, cresol-hydroxybenzaldehyde resins, vinyl phenol polymers, and mixtures thereof.

14. The composition of claim 1 wherein the aromatic hydroxyl containing compound is present in an amount of from about 1% to about 50% based on the weight of the nonsolvent parts of the composition.

15. The composition of claim 1 wherein the curing catalyst is selected from the group consisting of phosphines, arsines, and blends thereof.

16. A photographic element which comprises a substrate and a dried positive acting, photoimageable composition on the substrate, which composition comprises at least one a photoacid generator capable of generating an acid upon exposure to actinic radiation, at least one styrene-maleic anhydride polymer, at least one epoxy, at least one curing catalyst, and an optional aromatic hydroxyl containing monomer, polymer or mixture thereof wherein said at least one curing catalyst is selected from the group consisting of nitrogen containing curing catalysts, phosphine curing catalysts and arsine curing catalysts.

17. The photographic element of claim 16 wherein the substrates comprises a material selected from the group consisting of aluminum, steel, stainless steel, zinc, copper, chromium, polyester, polyimide, epoxy, silicon, gallium arsenide and glass.

* * * * *